(12) United States Patent
Mok et al.

(10) Patent No.: US 8,161,634 B2
(45) Date of Patent: Apr. 24, 2012

(54) METHOD OF FABRICATING A PRINTED CIRCUIT BOARD

(75) Inventors: Jee Soo Mok, Gyunggi-do (KR); Jun Heyoung Park, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1083 days.

(21) Appl. No.: 12/073,712

(22) Filed: Mar. 7, 2008

(65) Prior Publication Data

US 2008/0296055 A1 Dec. 4, 2008

(30) Foreign Application Priority Data

May 29, 2007 (KR) .................. 10-2007-0052162
Nov. 26, 2007 (KR) .................. 10-2007-0121026

(51) Int. Cl.
*H01K 3/22* (2006.01)
(52) U.S. Cl. ............. 29/851; 29/847; 174/261; 156/298
(58) Field of Classification Search ............ 174/255, 174/261; 156/298; 29/846–849, 851, 852
See application file for complete search history.

(56) References Cited

U.S. PATENT DOCUMENTS 2,958,120 A * 11/1960 Taylor ...................... 29/848
5,600,103 A * 2/1997 Odaira et al. ............. 174/261

FOREIGN PATENT DOCUMENTS

| JP | 2002-246753 | 8/2002 |
| JP | 2004-111651 | 4/2004 |
| JP | 2005-183587 | 7/2005 |

OTHER PUBLICATIONS

Japanese Patent Office Action, dated Jun. 15, 2010.

\* cited by examiner

*Primary Examiner* — Donghai D. Nguyen

(57) ABSTRACT

A method of fabricating a printed circuit, which involves forming a bump on a first metal layer; laminating an insulating layer on the bump so that the bumps passes through the insulating layer; placing a second metal layer on the insulating layer and then conducting heating and pressing, thus laminating the second metal layer on the insulating layer; etching the first metal layer and the second metal layer, thus forming circuit patterns on both surfaces of the insulating layer; and heating and pressing both surfaces of the insulating layer, thus embedding the circuit patterns in the insulating layer, such that the circuit pattern is embedded in an insulating layer to decrease the thickness of a printed circuit board, and the time and cost required for the process of fabricating a printed circuit board are decreased.

7 Claims, 4 Drawing Sheets

METHOD OF FABRICATING A PRINTED CIRCUIT BOARD

CROSS REFERENCE TO RELATED APPLICATIONS

This application claims the benefit of Korean Patent Application Nos. 10-2007-0052162, filed on May 29, 2007, entitled "Fabricating Method of Printed Circuit Board" and 10-2007-0121026, filed on Nov. 26, 2007, entitled "Printed circuit board and method for fabricating thereof", which are hereby incorporated by reference in their entirety into this application.

BACKGROUND OF THE INVENTION

1. Field of the Invention

The present invention relates, in general, to a printed circuit board (PCB) and a method of fabricating the same, and more particularly, to a PCB and a method of fabricating the same, in which the thickness of a circuit pattern is decreased to thus realize a fine circuit, the circuit pattern is embedded in an insulating layer to thus decrease the thickness of a PCB, and the time and cost required for the process of fabricating a PCB are decreased.

2. Description of the Related Art

According to the trend in which an electronic product is fabricated to be light, slim, short and small and to have multiple functions, a package mounted to the electronic product need be thin. Thus, a substrate, which is an important component of the package, is required to be thin and to have high density.

FIGS. 1A to 1D are sectional views sequentially illustrating the process of fabricating a PCB according to a conventional technique.

As illustrated in FIG. 1A, a metal layer laminate 100, in which a metal layer 104 is laminated on both surfaces of an insulating layer 102, is prepared.

Next, as illustrated in FIG. 1B, a via hole 106 is formed through the metal layer laminate by drilling.

After the formation of the via hole 106, an electroless copper plating layer 108 and a copper electroplating layer 110 are formed on the inner wall of the via hole 106 and on the metal layer 104 through electroless copper plating and copper electroplating, as illustrated in FIG. 1C.

After the formation of the electroless copper plating layer 108 and the copper electroplating layer 110, a dry film (not shown) is applied on the copper electroplating layer 110, and the portion of the dry film other than the portion of the dry film corresponding to a circuit pattern is removed through exposure and development.

Next, the copper electroplating layer 110, exposed by removing the portion of the dry film, the electroless copper plating layer 108, and the metal layer 104 are etched using an etchant, thus forming a circuit pattern 112 on both surfaces of the insulating layer 102, as illustrated in FIG. 1D.

However, the method of fabricating the PCB according to the conventional technique is disadvantageous because the circuit pattern 112, composed of the metal layer 104, the electroless copper plating layer 108, and the copper electroplating layer 110, is formed on both surfaces of the insulating layer 102, and thus the circuit pattern 110 is thick, and also, the circuit pattern 112 is formed to be exposed on both surfaces of the insulating layer 102, undesirably increasing the thickness of the PCB.

Further, the method of fabricating the PCB according to the conventional technique is disadvantageous because the circuit pattern 112 is composed of the metal layer 104, the electroless copper plating layer 108 and the copper electroplating layer 110, and thus, upon the formation of the circuit pattern 112, the over-etching of the outer portion of the circuit pattern 112 or the under-etching of the inner portion of the circuit pattern 112 may occur, making it difficult to realize a predetermined width, that is, a pitch, between adjacent circuit patterns, with the result that a fine circuit is not realized.

Furthermore, the method of fabricating the PCB according to the conventional technique is disadvantageous because the circuit pattern is formed using electroless copper plating and copper electroplating, undesirably increasing the time required for the process of fabricating a PCB.

SUMMARY OF THE INVENTION

Therefore, the present invention provides a PCB and a method of fabricating the same, in which the thickness of a circuit pattern is decreased, thus realizing a fine circuit, and the circuit pattern is embedded in an insulating layer, thus decreasing the thickness of the PCB.

In addition, the present invention provides a PCB and a method of fabricating the same, in which the time and cost required for the process of fabricating a PCB are decreased.

According to the present invention, a PCB may include an insulating layer; circuit patterns formed on both surfaces of the insulating layer in order to be embedded in the insulating layer; and a bump formed to pass through the insulating layer in order to electrically connect the circuit patterns formed on both surfaces of the insulating layer.

In the PCB according to the present invention, the circuit patterns and the insulating layer may be adhered using an adhesive.

In the PCB according to the present invention, the adhesive may have a glass transition temperature lower than that of the insulating layer.

In addition, according to the present invention, a method of fabricating a PCB may include a) forming a bump on a first metal layer; b) laminating an insulating layer on the bump so that the bumps passes through the insulating layer; c) placing a second metal layer on the insulating layer and then conducting heating and pressing, thus laminating the second metal layer on the insulating layer; d) etching the first metal layer and the second metal layer, thus forming circuit patterns on both surfaces of the insulating layer; and e) heating and pressing both surfaces of the insulating layer, thus embedding the circuit patterns in the insulating layer.

In the method of fabricating the PCB according to the present invention, the a) may include a-1) preparing the first metal layer; a-2) placing a mask having a hole on the first metal layer to be in close contact therewith, in which the hole is formed at a position corresponding to an area to which the bump is to be formed; a-3) filling the hole with a conductive paste using a squeegee; a-4) removing the mask; and a-5) drying the conductive paste, thus forming the bump.

In the method of fabricating the PCB according to the present invention, the c) may be conducted by heating and pressing both surfaces of the PCB under conditions of 50~150° C. and 1~30 kgf/cm$^2$.

In the method of fabricating the PCB according to the present invention, the e) may be conducted by heating and pressing the circuit patterns under conditions of temperature and pressure which are higher than in the c), thus embedding the circuit patterns in the insulating layer.

In the method of fabricating the PCB according to the present invention, the e) may be conducted by heating and pressing the circuit patterns under conditions of 150~300° C. and 30~50 kgf/cm².

In the method of fabricating the PCB according to the present invention, the b) may include b-1) applying an adhesive on both surfaces of the insulating layer; and b-2) laminating the insulating layer having the adhesive applied on both surfaces thereof on the bump so that the bump passes through the adhesive and the insulating layer.

In the method of fabricating the PCB according to the present invention, the c) may include melting the adhesive using heat applied to both surfaces of the PCB to thus adhere the first metal layer and the second metal layer to both surfaces of the insulating layer.

In the method of fabricating the PCB according to the present invention, the e) may include curing the insulating layer and the adhesive.

BRIEF DESCRIPTION OF THE DRAWINGS

The features and advantages of the present invention will be more clearly understood from the following detailed description taken in conjunction with the accompanying drawings, in which.

DESCRIPTION OF THE PREFERRED EMBODIMENTS

Hereinafter, a detailed description will be given of the preferred embodiments of the present invention, with reference to the appended drawings.

Figure 1A:
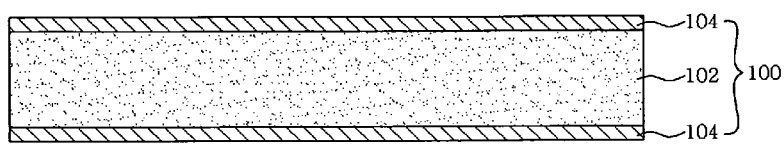
FIGS. 1A to 1D are sectional views sequentially illustrating the process of fabricating a PCB according to a conventional technique.
Figure 1B:
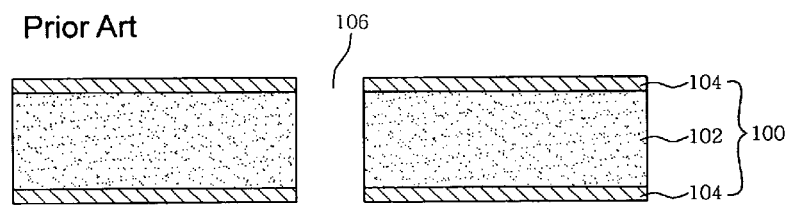
Figure 1C:
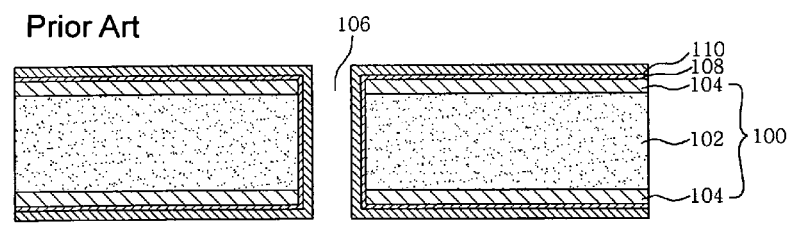
Figure 1D:
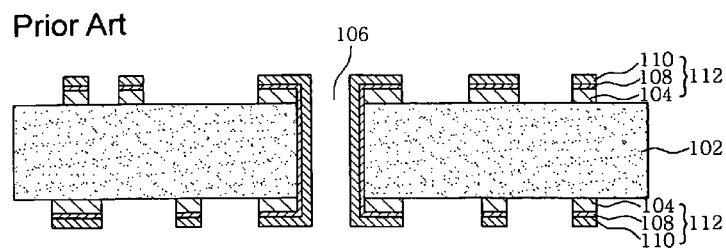
Figure 2:
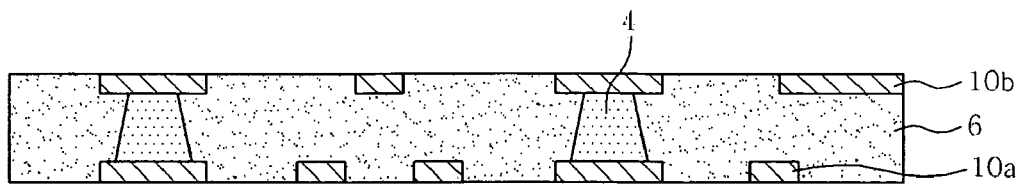
FIG. 2 is a view illustrating the PCB according to the present invention.

FIG. 2 is a view illustrating the PCB according to the present invention.

With reference to FIG. 2, the PCB according to the present invention includes an insulating layer 6, circuit patterns 10a, 10b formed on both surfaces of the insulating layer 6 in order to be embedded in the insulating layer, and bumps 4 formed to pass through the insulating layer 6 in order to electrically connect the circuit patterns 10a, 10b formed on both surfaces of the insulating layer 6.

The insulating layer 6 is formed of an epoxy resin, and plays a role in electrically isolating the circuit patterns 10a, 10b formed on both surfaces thereof.

The circuit patterns 10a, 10b are formed on both surfaces of the insulating layer 6 so that they are embedded in the insulating layer 6.

The circuit patterns 10a, 10b are formed from a metal layer.

The insulating layer 6 and the circuit patterns 10a, 10b are adhered using an epoxy-based adhesive having Tg (glass transition temperature) lower than that of the insulating layer 6.

The bumps 4 are formed to pass through the insulating layer 6, thus electrically connecting the circuit patterns 10a, 10b, which are formed on both sides of the insulating layer 6.

FIGS. 3A to 3F are sectional views sequentially illustrating the process of fabricating a PCB according to a first embodiment of the present invention.

Figure 3A:
FIGS. 3A to 3F are sectional views sequentially illustrating the process of fabricating a PCB according to a first embodiment of the present invention.

As illustrated in FIG. 3A, a first metal layer 2 is prepared.

As the first metal layer 2, a copper foil is used.

Figure 3B:
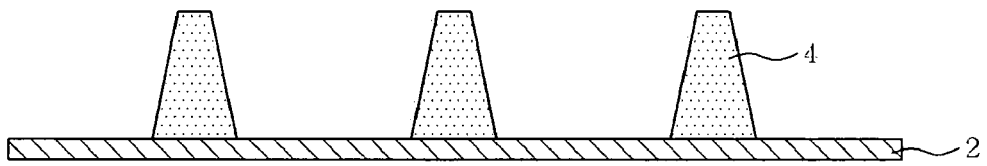

Next, bumps 4 are formed on the first metal layer 2, as illustrated in FIG. 3B.

Useful for interlayer connection, the bumps 4 are formed by placing a mask having holes on the first metal layer 2 to be in close contact therewith, in which the holes are formed at positions corresponding to areas to which the bumps 4 are to be formed, printing a conductive paste using a squeegee to thus fill the holes with the conductive paste, and then removing the mask.

Because the conductive paste has high viscosity, when the conductive paste is printed and is then dried, the bumps 4 are formed.

When the bumps 4 are formed, the printing and drying of the conductive paste are repeated several times (e.g., three or four times), thus adjusting the height of the bumps 4.

Figure 3C:
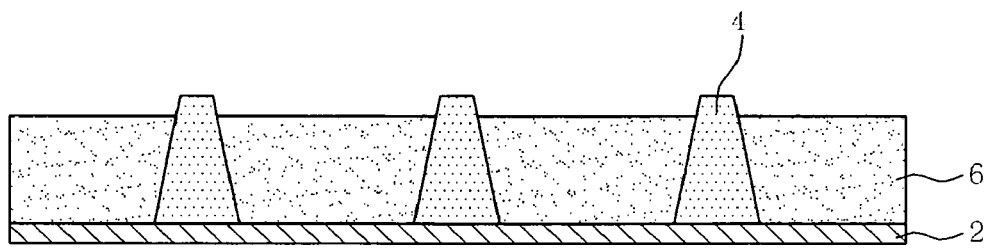

After the formation of the bumps 4, an insulating layer 6 is laminated on the bumps 4, as illustrated in FIG. 3C.

As the insulating layer 6, a prepreg or an epoxy resin in a semi-cured state is used, and the insulating layer 6 is laminated on the bumps 4 so that the bumps 4 pass through the insulating layer 6.

Figure 3D:
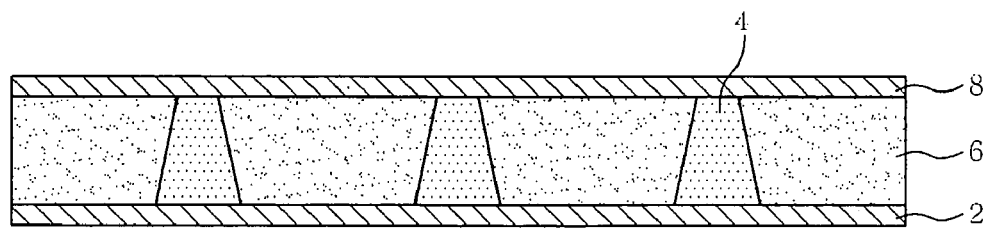

After the lamination of the insulating layer 6, a second metal layer 8 is placed on the insulating layer 6, and is then heated and pressed using a first press, by which the second metal layer 8, for example, a copper foil, is laminated on the insulating layer 6, as illustrated in FIG. 3D.

As such, the insulating layer 6 is maintained in a semi-cured state.

When the second metal layer 8 is laminated using the first press, both surfaces of the PCB, that is, the first metal layer 2 and the second metal layer 8, are heated and pressed under conditions of 50~150° C. and 1~30 kgf/cm², by which the second metal layer 8 is laminated on the insulating layer 6.

After the lamination of the second metal layer 8, a dry film (not shown) is applied on the first metal layer 2 and the second metal layer 8, and the portion of the dry film other than the portion of the dry film corresponding to a circuit pattern is removed through exposure and development.

Figure 3E:
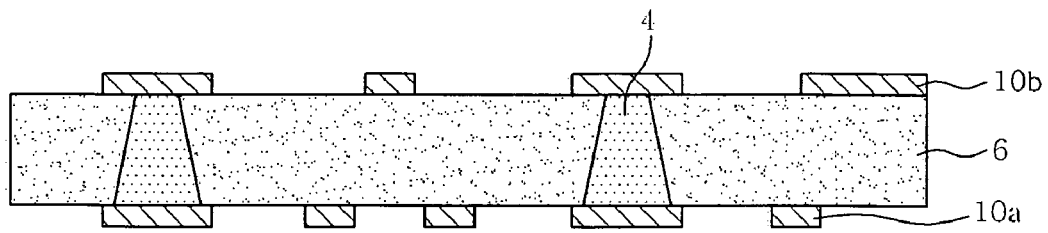
Figure 3F:
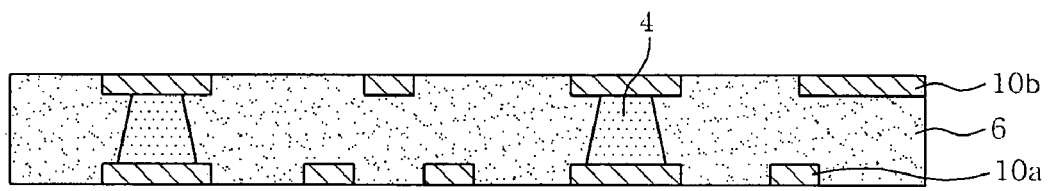

Next, the first metal layer 2 and the second metal layer 8 are etched using an etchant, thus forming circuit patterns 10a, 10b on both surfaces of the insulating layer 6, as illustrated in FIG. 3E.

After the formation of the circuit patterns 10a, 10b, the dry film, remaining on the circuit patterns 10a, 10b, is removed.

Next, the PCB having the circuit patterns 10a, 10b is heated and pressed using a second press, thus embedding the circuit patterns 10a, 10b in the insulating layer 6.

As such, the outer surfaces of the circuit patterns 10a, 10b are flush with the insulating layer 6.

Specifically, the circuit patterns 10a, 10b are embedded in the insulating layer 6 so that the outer surfaces of the circuit patterns 10a, 10b embedded in the insulating layer 6 are flush with the surface of the insulating layer 6.

The circuit patterns 10a, 10b are heated and pressed using the second press under conditions of 150~300° C. and 30~50 kgf/cm², which are higher than when using the first press, thus embedding the circuit patterns 10a, 10b in the insulating layer 6.

As such, the insulating layer 6 in a semi-cured state is cured.

In the method of fabricating the PCB according to the first embodiment of the present invention using B2it (Buried Bump Interconnection Technology), because the circuit patterns 10a, 10b are composed exclusively of the metal layers 2, 8, the thickness of the circuit patterns 10a, 10b may be decreased. Hence, when the metal layers 2, 8 are etched to form the circuit patterns 10a, 10b, it is possible to prevent the over-etching of the outer portions of the circuit patterns 10a, 10b and the under-etching of the inner portions of the circuit patterns 10a, 10b, thereby realizing a fine circuit.

In the method of fabricating the PCB according to the first embodiment of the present invention, the circuit patterns 10a, 10b are embedded in the insulating layer 6, thus decreasing the thickness of the PCB.

In the method of fabricating the PCB according to the first embodiment of the present invention, electroless copper plating and copper electroplating are not conducted upon the formation of the circuit patterns 10a, 10b, thus decreasing the time and cost required for the process of fabricating the PCB.

FIGS. 4A to 4F are sectional views sequentially illustrating the process of fabricating a PCB according to a second embodiment of the present invention.

Figure 4A:
FIGS. 4A to 4F are sectional views sequentially illustrating the process of fabricating a PCB according to a second embodiment of the present invention.

As illustrated in FIG. 4A, a first metal layer 22 is prepared.

As the first metal layer 22, a copper foil is used.

Figure 4B:
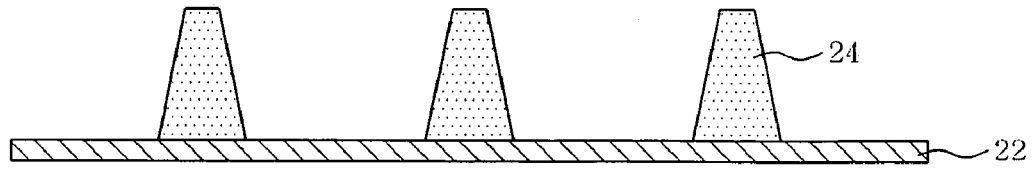

Next, bumps 24 are formed on the first metal layer 22, as illustrated in FIG. 4B.

Useful for interlayer connection, the bumps 24 are formed by placing a mask having holes on the first metal layer 22 to be in close contact therewith, in which the holes are formed at positions corresponding to areas to which the bumps 24 are to be formed, printing a conductive paste using a squeegee to thus fill the holes with the conductive paste, and then removing the mask.

Because the conductive paste has high viscosity, when the conductive paste is printed and is then dried, the bumps 24 are formed.

When the bumps 24 are formed, the printing and drying of the conductive paste are repeated several times (e.g., three or four times), thus adjusting the height of the bumps 24.

Figure 4C:
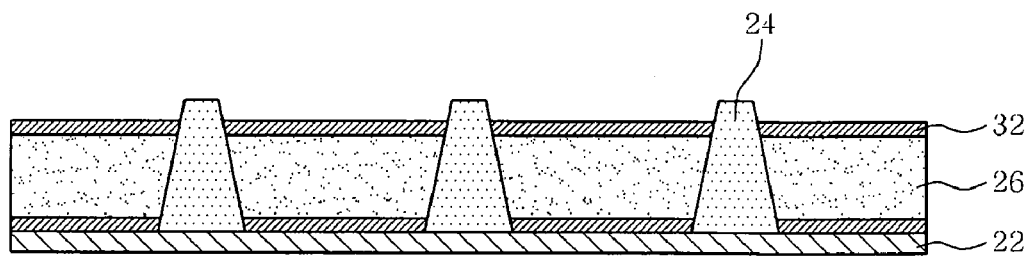

After the formation of the bumps 24, an insulating layer 26, both surfaces of which are coated with an adhesive 32, is laminated on the bumps 24, as illustrated in FIG. 4C.

Specifically, the adhesive 32 is applied on both surfaces of the insulating layer 26, after which the insulating layer 26 having the adhesive 32 applied on both surfaces thereof is laminated on the bumps 24.

The adhesive 32 is exemplified by an epoxy-based product having Tg lower than that of the insulating layer 26, in order to increase the force of adhesion between a circuit pattern, which is subsequently formed, and the insulating layer 26. The insulating layer 26 is formed of an epoxy resin in a semi-cured state.

In the lamination of the insulating layer 26 of FIG. 4C, the bumps 24 are formed to pass through the insulating layer 26 and the adhesive 32.

Figure 4D:
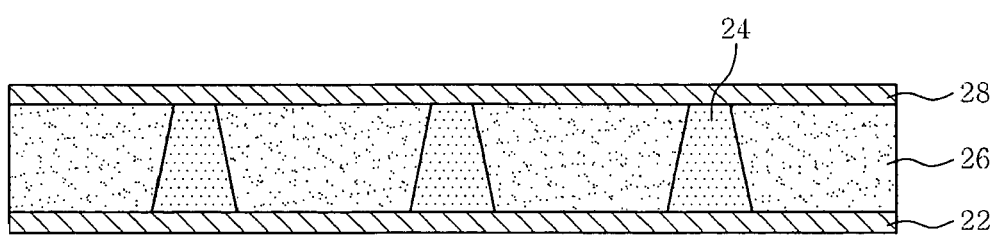

After the lamination of the insulating layer 26, a second metal layer 28 is placed on the insulating layer 26, and is then heated and pressed using a first press, by which the second metal layer 28 is laminated on the insulating layer 26, as illustrated in FIG. 4D.

As such, the insulating layer 26 is maintained in a semi-cured state.

When the second metal layer 28 is laminated using the first press, both surfaces of the PCB, that is, the first metal layer 22 and the second metal layer 28, are heated and pressed under conditions of 50~150° C. and 1~30 kgf/cm$^2$, by which the second metal layer 28 is laminated on the insulating layer 26.

At this time, the adhesive 32 applied on both surfaces of the insulating layer 26 is melted by heat from the first press, such that the first metal layer 22 and the second metal layer 28 are adhered to both surfaces of the insulating layer 26.

The force of adhesion between the insulating layer 26 and the first metal layer 22 or the second metal layer 28 is increased thanks to the adhesive 32.

After the lamination of the second metal layer 28, a dry film (not shown) is applied on the first metal layer 22 and the second metal layer 28, and the portion of the dry film other than the portion of the dry film corresponding to circuit patter electroless copper plating and copper electroplating n is removed through exposure and development.

Figure 4E:
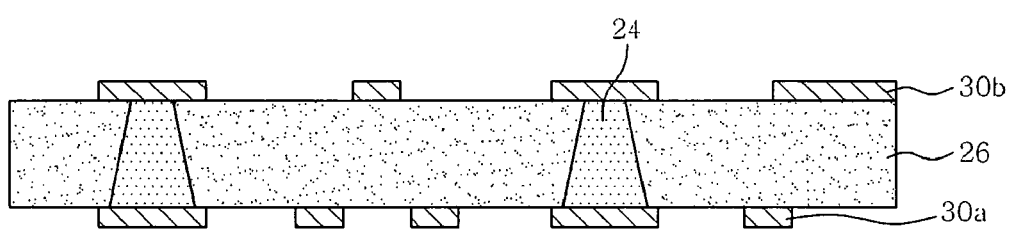
Figure 4F:
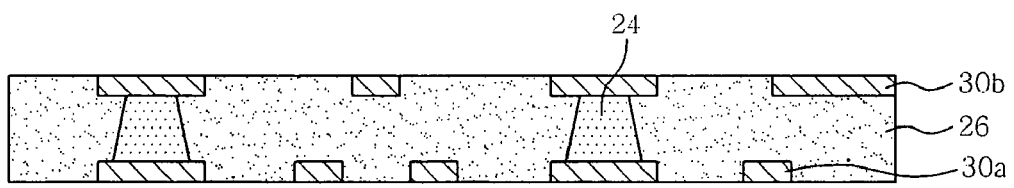

Next, the first metal layer 22 and the second metal layer 28 are etched using an etchant, thus forming circuit patterns 30a, 30b on both surfaces of the insulating layer 26, as illustrated in FIG. 4E.

After the formation of the circuit patterns 30a, 30b, the dry film, remaining on the circuit patterns 30a, 30b, is removed.

Next, the PCB having the circuit patterns 30a, 30b is heated and pressed using a second press, thus embedding the circuit patterns 30a, 30b in the insulating layer 26.

As such, the outer surfaces of the circuit patterns 30a, 30b are flush with the insulating layer 26.

Specifically, the circuit patterns 30a, 30b are embedded in the insulating layer 26 so that the outer surfaces of the circuit patterns 30a, 30b embedded in the insulating layer 26 are flush with the surface of the insulating layer 26.

The circuit patterns 30a, 30b are heated and pressed using the second press under conditions of 150~300° C. and 30~50 kgf/cm$^2$, which are higher than when using the first press, thus embedding the circuit patterns 30a, 30b in the insulating layer 26.

As such, the insulating layer 26 in a semi-cured state and the adhesive 32 applied on both surfaces of the insulating layer are cured.

In the method of fabricating the PCB according to the second embodiment of the present invention using B2it, because the circuit patterns 30a, 30b are composed exclusively of the metal layers 22, 28, the thickness of the circuit patterns 30a, 30b may be decreased. Thus, when the metal layers 22, 28 are etched to form the circuit patterns 30a, 30b, it is possible to prevent over-etching of the outer portions of the circuit patterns 30a, 30b and under-etching of the inner portions of the circuit patterns 30a, 30b, thereby realizing a fine circuit.

In the method of fabricating the PCB according to the second embodiment of the present invention, because the insulating layer 26 and the circuit patterns 30a, 30b are adhered using the adhesive 32 applied on both surfaces of the insulating layer 26, the force of adhesion between the insulating layer 26 and the circuit patterns 30a, 30b is greater than that of the PCB formed through the method of fabricating a PCB according to the first embodiment of the present invention.

In the method of fabricating the PCB according to the second embodiment of the present invention, the circuit patterns 30a, 30b are embedded in the insulating layer 26, thus decreasing the thickness of the PCB, and furthermore, the force of adhesion between the circuit patterns 30a, 30b and the insulating layer 26 may be increased thanks to the adhesive 32, which is applied on both surfaces of the insulating layer 26.

In the method of fabricating the PCB according to the second embodiment of the present invention, electroless copper plating and copper electroplating are not conducted upon the formation of the circuit patterns 30a, 30b, thus decreasing the time and cost required for the process of fabricating a PCB.

As described hereinbefore, the present invention provides a PCB and a method of fabricating the same. According to the present invention, because a circuit pattern is composed solely of a metal layer, the thickness of the circuit pattern can be decreased. Thus, when the metal layer is etched to form the circuit pattern, over-etching of the outer portion of the circuit pattern and under-etching of the inner portion of the circuit pattern can be prevented, thereby realizing a fine circuit.

Further, according to the present invention, because the circuit pattern is embedded in an insulating layer, the thickness of the PCB can be decreased and the force of adhesion between the circuit pattern and the insulating layer can be increased thanks to the adhesive, which is applied on both surfaces of the insulating layer.

Furthermore, according to the present invention, because electroless copper plating and copper electroplating are not conducted upon the formation of the circuit pattern, the time and cost required for the process of fabricating a PCB can be reduced.

Although the preferred embodiments of the present invention have been disclosed for illustrative purposes, those skilled in the art will appreciate that various modifications, additions and substitutions are possible within the technical spirit of the invention.

What is claimed is:

1. A method of fabricating a printed circuit board, comprising:
    forming a bump on a first metal layer;
    laminating an insulating layer on the bump so that the bump passes through the insulating layer;
    placing a second metal layer on the insulating layer and then conducting heating and pressing, thus laminating the second metal layer on the insulating layer;
    etching the first metal layer and the second metal layer, thus forming circuit patterns on both surfaces of the insulating layer; and
    heating and pressing both surfaces of the insulating layer, thus embedding the circuit patterns in the insulating layer,
    wherein the laminating further comprises:
    applying an adhesive on both surfaces of the insulating layer; and
    laminating the insulating layer having the adhesive applied on both surfaces thereof on the bump so that the bump passes through the adhesive and the insulating layer.

2. The method as set forth in claim 1, wherein the forming a bump comprises:
    preparing the first metal layer;
    placing a mask having a hole on the first metal layer to be in close contact therewith, in which the hole is formed at a position corresponding to an area to which the bump is to be formed;
    filling the hole with a conductive paste using a squeegee;
    removing the mask; and
    drying the conductive paste, thus forming the bump.

3. The method as set forth in claim 1, wherein the heating and pressing the second metal layer is conducted by heating and pressing both surfaces of the printed circuit board under conditions of 50~150° C. and 1~30 kgf/cm$^2$.

4. The method as set forth in claim 1, wherein the heating and pressing both surfaces of the insulating layer is conducted by heating and pressing the circuit patterns under conditions of temperature and pressure which are higher than in the heating and pressing the second metal layer, thus embedding the circuit patterns in the insulating layer.

5. The method as set forth in claim 4, wherein the heating and pressing both surfaces of the insulating layer is conducted by heating and pressing the circuit patterns under conditions of 150~300° C. and 30~50 kgf/cm$^2$.

6. The method as set forth in claim 1, wherein the heating and pressing the second metal layer comprises melting the adhesive using heat applied to both surfaces of the printed circuit board to thus adhere the first metal layer and the second metal layer to both surfaces of the insulating layer.

7. The method as set forth in claim 1, wherein the heating and pressing both surfaces of the insulating layer comprises curing the insulating layer and the adhesive.

* * * * *